(12) United States Patent
Noda et al.

(10) Patent No.: US 6,583,849 B1
(45) Date of Patent: Jun. 24, 2003

(54) APPARATUS FOR EXPOSURE OF PHOTO-CURING RESIN APPLIED TO PRINTED CIRCUIT BOARD

(75) Inventors: Masanori Noda, Komaki (JP); Hirotaka Ogawa, Komaki (JP)

(73) Assignee: Noda Screen Co., Ltd., Aichi (JP)

( * ) Notice: Subject to any disclaimer, the term of this patent is extended or adjusted under 35 U.S.C. 154(b) by 157 days.

(21) Appl. No.: 09/629,433

(22) Filed: Jul. 31, 2000

Related U.S. Application Data

(62) Division of application No. 09/005,233, filed on Jan. 9, 1998, now Pat. No. 6,165,544.

(51) Int. Cl.⁷ .................. G03B 27/00; G03B 27/32; B05D 5/12; G03C 5/00; H01L 21/00

(52) U.S. Cl. .................. 355/18; 355/23; 355/24; 355/26; 355/27; 355/30; 355/35; 427/96; 427/97; 427/88; 430/311; 430/312; 430/314; 430/315; 438/10; 438/17

(58) Field of Search .................. 355/18, 23, 24, 355/26, 27, 30, 35; 427/96, 97, 98; 430/311, 312, 314, 315; 438/10, 17

(56) References Cited

U.S. PATENT DOCUMENTS

| | | | |
|---|---|---|---|
| 3,714,007 A | | 1/1973 | Borrell et al. ......... 204/159.15 |
| 3,746,541 A | * | 7/1973 | Sharp |
| 4,016,306 A | | 4/1977 | Miyagawa et al. ......... 427/508 |
| 4,544,626 A | * | 10/1985 | Sullivan |
| 5,356,754 A | * | 10/1994 | Kushi et al. |
| 5,891,606 A | * | 4/1999 | Brown |
| 6,046,060 A | * | 4/2000 | Budnaitis |
| 6,165,544 A | * | 12/2000 | Noda et al. |

FOREIGN PATENT DOCUMENTS

| | | |
|---|---|---|
| JP | 54-93457 | 7/1979 |
| JP | 55-50685 | 4/1980 |
| JP | 63-19894 | 1/1988 |
| JP | 63019894 AH * | 1/1988 |
| JP | 63-62393 | 3/1988 |
| JP | 1-141043 | 6/1989 |
| JP | 4-135827 | 5/1992 |
| JP | 4-268340 | 9/1992 |
| JP | 4-314392 | 11/1992 |
| JP | 5-235546 | 9/1993 |
| JP | 7-30255 | 1/1995 |
| JP | 9-55577 | 2/1997 |

* cited by examiner

Primary Examiner—Russell Adams
Assistant Examiner—Khaled Brown
(74) Attorney, Agent, or Firm—Wenderoth, Lind & Ponack, L.L.P.

(57) ABSTRACT

In exposing a photocurable resin to light, the light is irradiated on the photocurable resin while a base material to which the photocurable resin is applied is immersed in a liquid. An apparatus for carrying out the exposure includes an exposure tank in which a liquid does not dissolve the photocurable resin is reserved and a light source irradiating light to the photocurable resin is immersed in the liquid reserved in the tank. The exposure tank has two opposite side walls which have exposure windows closed by transparent plates respectively. The apparatus may include a plurality of light sources disposed so as to correspond to the representative exposing window. A temperature of the liquid in which the base material is immersed is controlled.

4 Claims, 5 Drawing Sheets

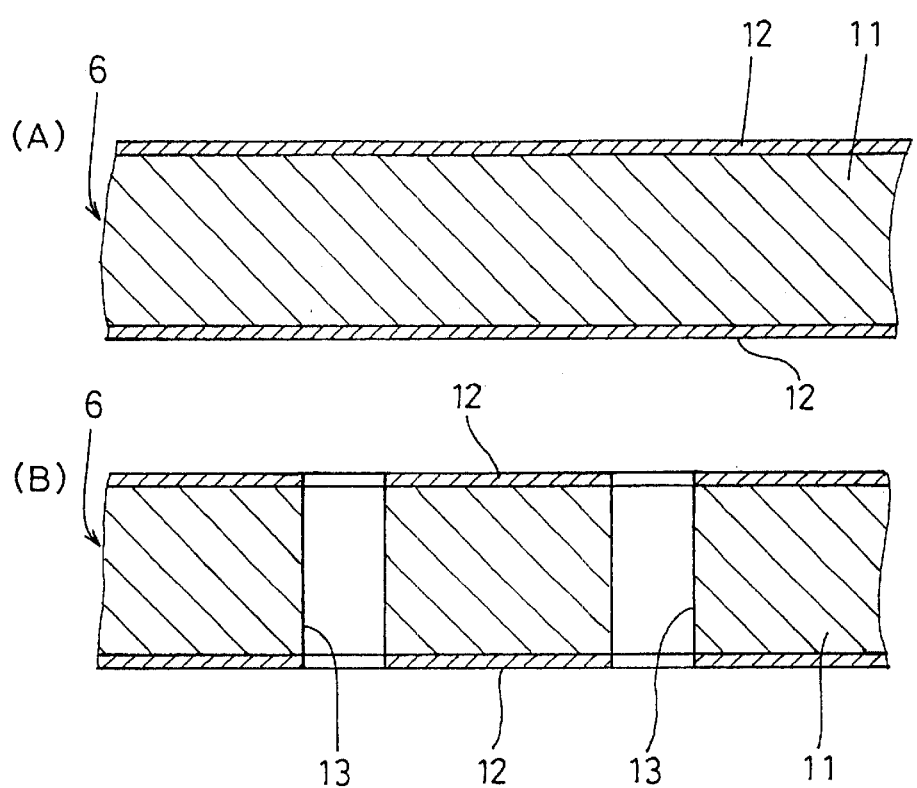

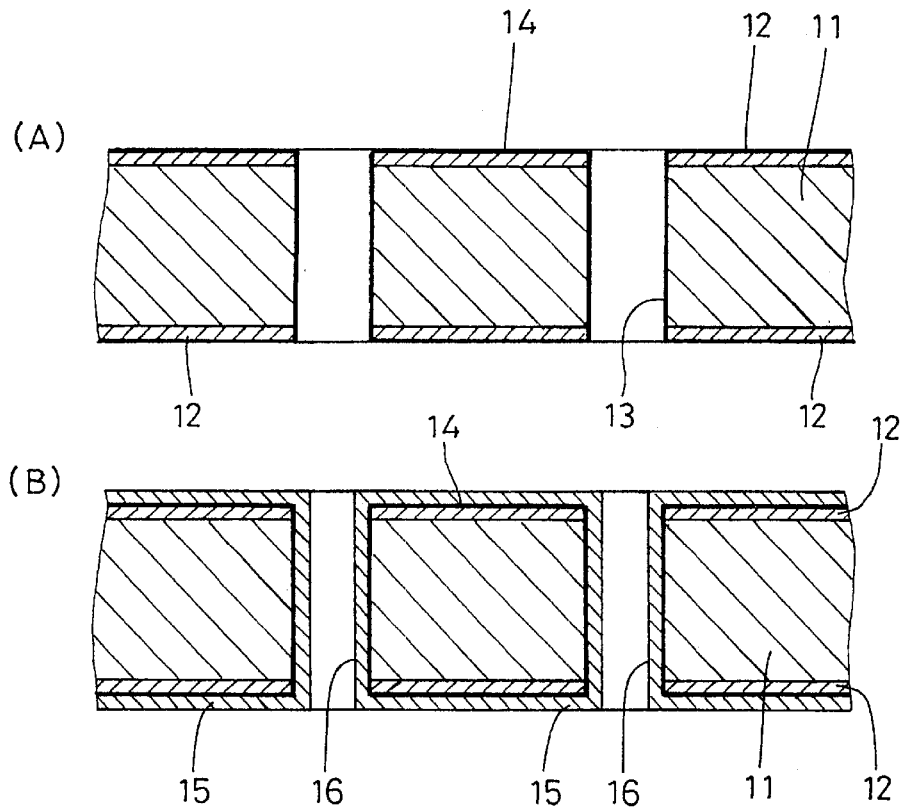

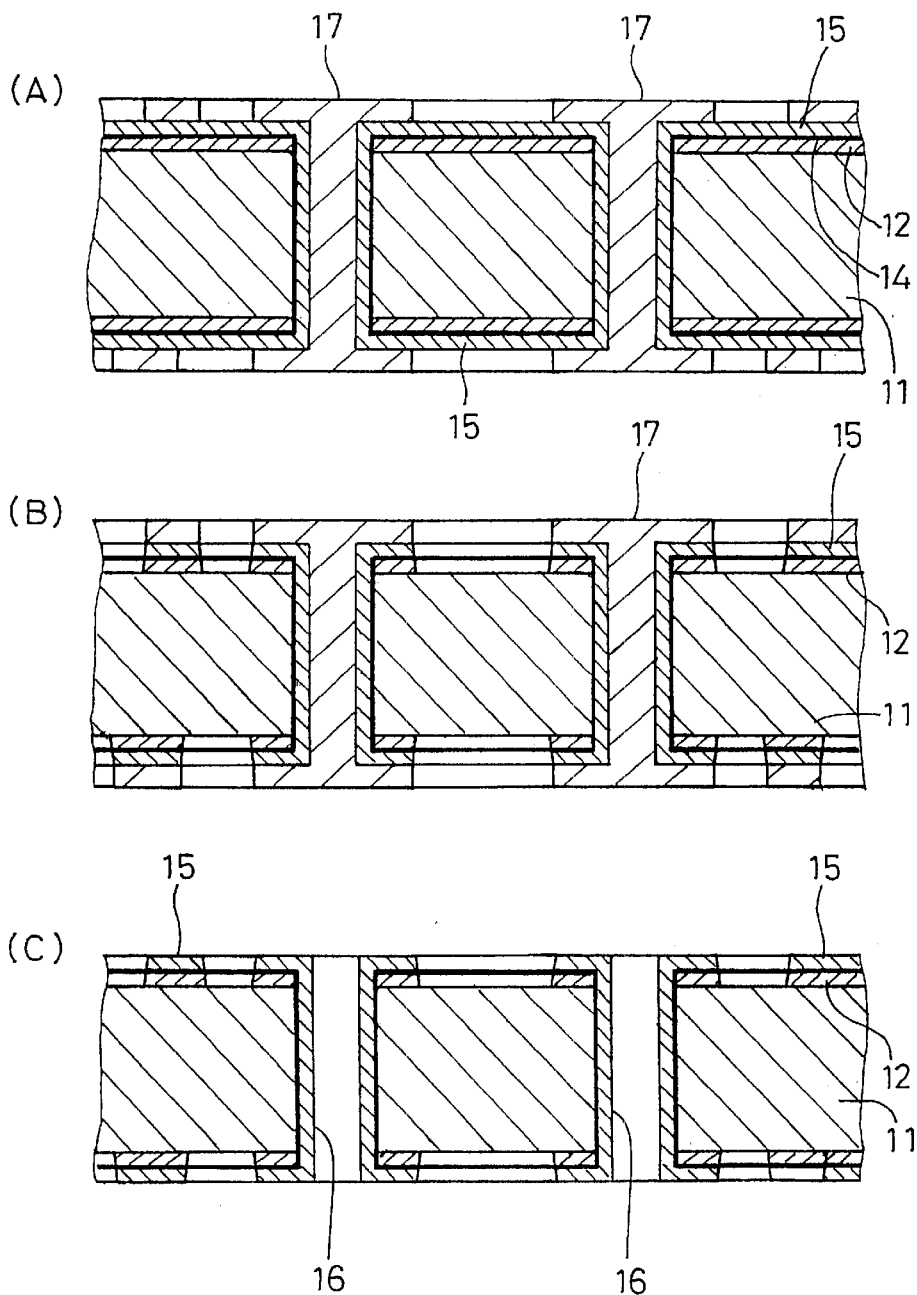

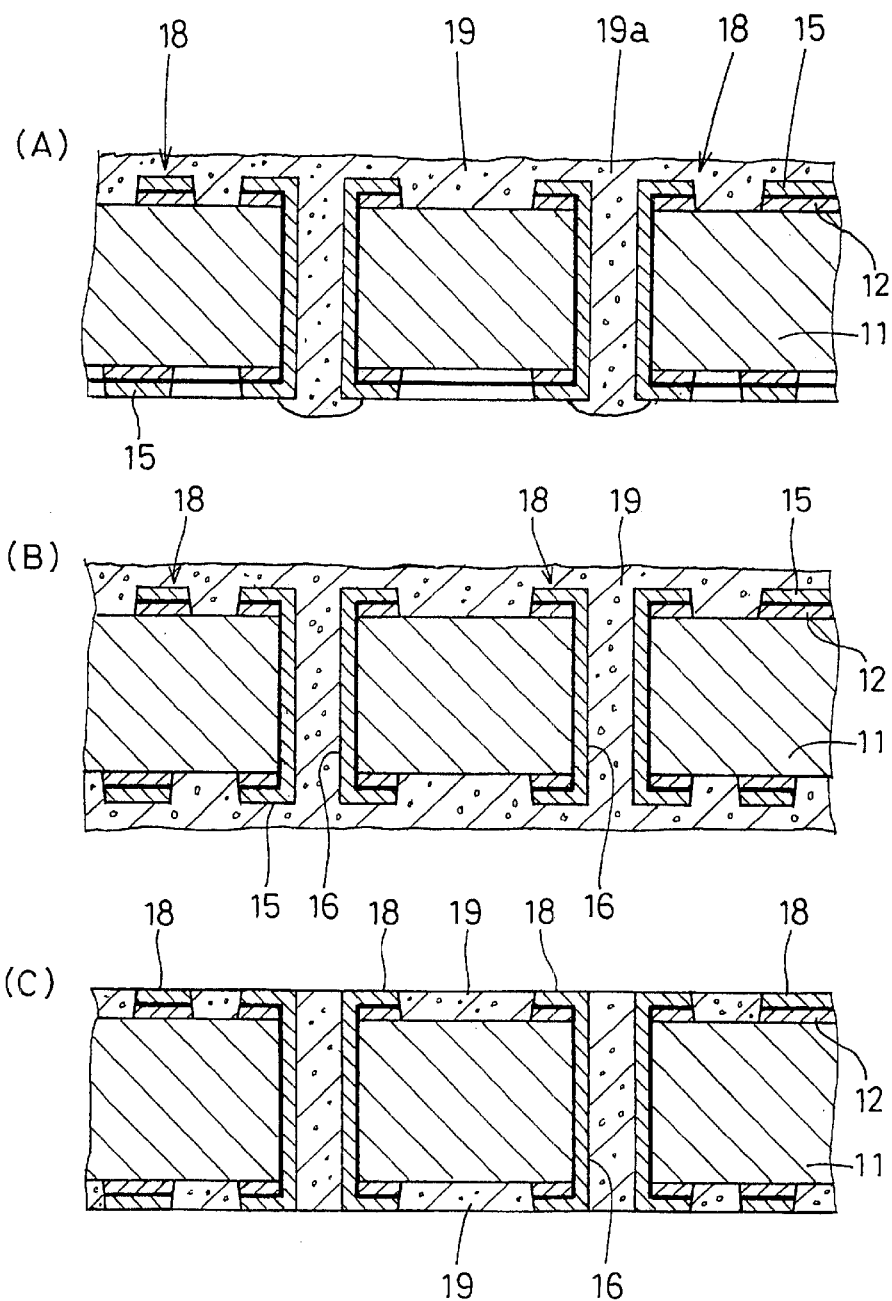

APPARATUS FOR EXPOSURE OF PHOTO-CURING RESIN APPLIED TO PRINTED CIRCUIT BOARD

This application is a divisional of application Ser. No. 09/005,233, filed Jan. 9, 1998, now U.S. Pat. No. 6,165,544.

BACKGROUND OF THE INVENTION

1. Field of the invention

This invention relates to a method of exposing a photo-curing type resin to light, an apparatus therefor, and a method of fabricating a printed circuit board by use of the exposing method.

2. Description of the prior art

In order that an ultraviolet-curing type ink may be applied to a surface of a printed circuit board to be hardened, the printed circuit board to which the ink has been applied is conventionally be carried by a conveyor. The printed circuit board is exposed to ultraviolet light from ultraviolet lamps during the conveyance.

The above-described method has the following drawbacks. First, radiant heat from the ultraviolet lamps increases a temperature of the ink, resulting in occurrence of air bubbles in the resin. The air bubbles sometimes reside as voids in the hardened resin.

Second, the increase in the temperature of the ink exposed to the ultraviolet light promotes or hastens hardening. This causes bridging density more than required and accordingly, excessively increases the hardness of the ink. When the hardness of the hardened ink is excessively increased, difficulty accompanies a step of grinding the hardened ink.

Third, when the ink is screen-printed on the printed circuit board, for example, an atmospheric pressure is merely applied to the ink after the screen printing. Accordingly, minute air bubbles contained in the ink during the screen printing cannot sufficiently be eliminated. The ink is thus hardened with the minute air bubbles contained therein.

SUMMARY OF THE INVENTION

Therefore, an object of the present invention is to solve the above-described drawbacks and more particularly, to provide a method of exposing a photo-curing type resin wherein the temperature of the photo-curing type resin during exposure to light can be controlled so that the voids and the excessive bridging density resulting from the temperature increase are prevented, and an apparatus therefor.

In one aspect, the present invention provides a method of exposing a photo-curing type resin which is hardened when exposed to light, comprising the step of exposing the resin to light while a base material to which the photo-curing type resin is applied is immersed in a liquid.

A liquid has a larger heat capacity and a larger specific heat than a gas. Accordingly, the liquid has a heat sinking property restraining variations in a temperature of a body in contact therewith superior to the gas. Since the light is irradiated to the photo-curing type resin while the resin is immersed in the liquid, the variations in the temperature of the resin is restrained by the heat sinking property of the liquid in contact therewith. Furthermore, liquid pressure is applied to the photo-curing type resin from around the same in the liquid reserved in the exposure tank. Consequently, even when minute air bubbles are contained in the resin as the result of the screen printing, the air bubbles can be eliminated from the resin layer by the liquid pressure applied to the resin.

In order that the above-described method may be carried out, an exposure tank reserving the liquid has a side wall which has an exposure window closed by a transparent plate, and the light from a light source disposed outside the exposure tank is irradiated through the transparent plate to the photo-curing type resin. Since the light source is prevented from coming into contact with the liquid by an insulating structure, the maintenance of the light source can be simplified.

Furthermore, a liquid circulating passage is preferably provided through which the liquid reserved in the exposure tank is circulated, and a heat exchanger is preferably provided in the liquid circulating passage for exchanging heat of the liquid so that a temperature of the liquid is maintained in a predetermined range. Consequently, the bridging density of the resin can be controlled to take a predetermined value.

Other objects, features and advantages of the present invention will become clear upon reviewing the following description of preferred embodiments thereof, made with reference to the accompanying drawings, in which:

FIGS. 3A and 3B are enlarged sectional views showing a through hole forming step in the fabrication of a printed circuit board in accordance with a second embodiment of the invention;

FIGS. 4A and 4B are enlarged sectional views showing a hole conductor layer forming step in the fabrication of the printed circuit board;

FIGS. 5A, 5B and 5C are enlarged sectional views showing a circuit pattern forming step in the fabrication of the printed circuit board; and FIGS. 6A, 6B and 6C are enlarged sectional views showing a circuit pattern embedding step and a grinding step in the fabrication of the printed circuit board.

DETAILED DESCRIPTION OF THE PREFERRED EMBODIMENTS

A first embodiment of the present invention will be described with reference to FIGS. 1 and 2. The embodiment is directed to the fabrication of a printed circuit board having through holes filled with a photo-curing type resin.

Figure 1:
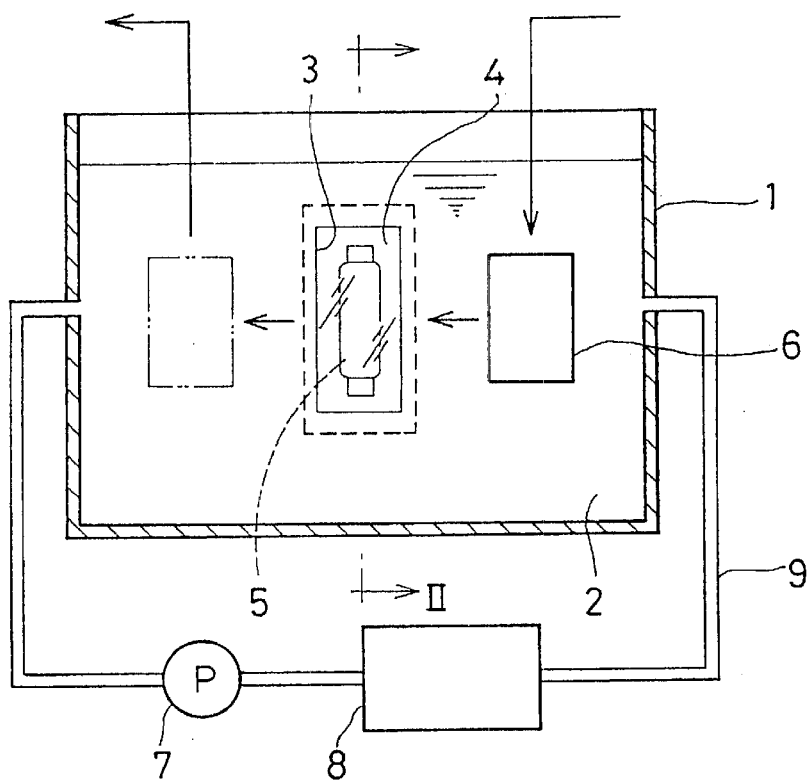
FIG. 1 is a sectional view of an exposure tank employed in the exposing apparatus of a first embodiment in accordance with the present invention.

Referring to FIG. 1, an exposing apparatus comprising an exposure tank 1 having an upper opening is shown. Water is reserved in the exposure tank 1. The exposure tank 1 has a pair of opposite side walls 2 formed with respective exposure windows 3. Transparent plates 4 are fitted in the exposure windows 3 respectively. Two light sources 5 each comprising an ultraviolet lamp are disposed outside the respective transparent plates 4 so that ultraviolet light is irradiated through the exposure windows 3 into the exposure tank 1.

Figure 2:
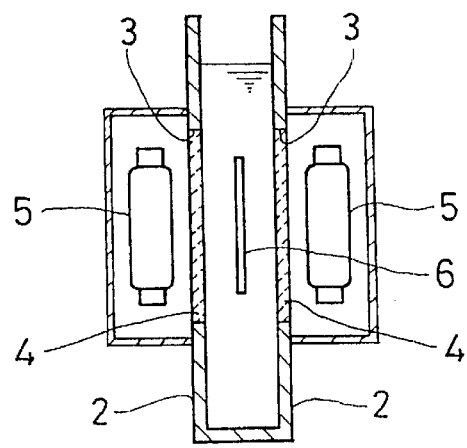
FIG. 2 is a view taken along line 1—1 in FIG. 2.

A portion of the exposure tank formed with the exposure windows 3 has a reduced width as shown in FIG. 2. For example, a distance between the two transparent plates 4 is set at about 20 cm. A conveyor (not shown) is provided over the exposure tank 1. A printed circuit board 6 conveyed on the conveyor is immersed in the water in the right-hand interior of the exposure tank 1. The printed circuit board 6 is then conveyed through a water channel between the exposure windows 3 to the left. The printed circuit board 6 is lifted up at the left-hand interior of the exposure tank 1.

A circulation pipe passage 9 communicates with the exposure tank 1. The circulation pipe passage 9 has a circulation pump 7 and a heat exchanger 8. The circulation pump 8 is operated to circulate the water in the exposure tank 1 through the heat exchanger 8. The heat exchanger 8 exchanges heat between the water in the exposure tank 1 and refrigerant cooled by an evaporator (not shown). As the result of the heat exchange, a temperature of the water in the exposure tank 1 is maintained in a predetermined range, for example, a range between 10 and 20° C.

The method of exposure by use of the above-described exposing apparatus will now be described. Processes for printing an ultraviolet-curing type permanent resist ink on the printed circuit board 6 and hardening the printed ink will be described. The permanent resist ink used in the embodiment is of an epoxy indissoluble type and is printed by a normal screen printing. When the printed circuit board 6 has through holes, the permanent resist ink is applied to the printed circuit board 6 so as to fill the through holes.

The printed circuit board 6 to which the permanent resist ink has been applied is conveyed over the exposure tank 1 by the conveyor. First, the printed circuit board 6 is immersed in the water in the right-hand interior of the exposure tank 1. Since the permanent resist ink is indissoluble in water, the immersion does not result in any chemical changes in the ink. However, a temperature of the permanent resist ink is approximately equalized with the water temperature. Furthermore, water pressure is uniformly applied to the ink when the printed circuit board 6 is immersed in the water. Consequently, minute air bubbles unavoidably contained in the permanent resist ink during the screen printing may be forced out by the water pressure.

The printed circuit board 6 is then moved in the water between the exposure windows 3 in the exposure tank 1. During the movement of the printed circuit board 6 through the water channel between the exposure windows, the ultraviolet light from the light sources 5 is irradiated to a resist layer so that hardening is started. A time period of the ultraviolet irradiation is equal to a time period required for securing an amount of ultraviolet light necessary for the hardening of the resist ink. The ultraviolet light is generally irradiated for a short time period from one minute to one minute and thirty seconds. A large radiant heat energy from the light sources 5 tends to increase the temperature of the resist layer during the ultraviolet irradiation. In the embodiment, however, the resist layer is immersed in the low-temperature water. Furthermore, a wide area of the resist layer is in contact with the water. Consequently, the increase in the temperature of the resist ink layer is reliably restrained by the heat sinking property of the water. The temperature of the resist ink layer is within the set range of the water temperature between 10 and 20° C.

Thus, since substantially no air bubbles are formed in the ink layer due to a rapid increase in the temperature, the voids can reliably be prevented from remaining in the hardened resin layer. This sufficiently improves the characteristics of the permanent resist of the printed circuit board, for example, the heat-resistance, moisture-resistance, electrical resistance, etc. As a result, a high quality of resist layer can be obtained.

Furthermore, since the ink is hardened under the condition at the predetermined temperature, the bridging density thereof can be within an expected range. Consequently, the permanent resist layer can be prevented from being excessively hardened by an excessive increase in the bridging density. Accordingly, the grinding step can readily be carried out without difficulty after the hardening step. Furthermore, since the light sources 5 are disposed outside the exposure tank 1 and accordingly, separated from the water in the tank, an insulating structure of each light source 5 and accordingly the maintenance thereof can be simplified. Additionally, since an amount of heat generated by each light source 5 to penetrate into the exposure tank 1 is reduced, the temperature of the water can readily be controlled. This increases the accuracy in the control of the temperature of the permanent resist layer during the hardening.

Upon completion of the exposure, the printed circuit board 6 is lifted out of the exposure tank 1 by the conveyor and moved to a drier (not shown) for drying.

Although the water is reserved in the exposure tank 1 in the foregoing embodiment, another liquid which does not dissolve the photo-curing type resin may be used, instead. For example, when the light irradiation under the condition at a low temperature is preferred, liquefied nitrogen may be used. Furthermore, liquids of the alcohol system such as methanol, ethanol, or isopropyl alcohol may be used depending upon the types of the photo-curing type resins. Other usable liquids include liquids of the hydrocarbon system such as heptane, mineral spirit, liquid paraffin, and xylene, liquids of the halogen system such as methylene chloride, trichloroethane, perchloroethylene, methyl bromide, propyl bromide, Freon 113, HCFC 225, and xylenehexachloride, polyvalent alcohol derivatives such as ethylene glycol and ethylene glycol dimethyl ether, and oils such as terepyne oil, kerosene, and silicon oil. A mixture of these liquids may be used. Additionally, various additives such as antiseptic may be added to these liquids.

Although the epoxy indissoluble type permanent resist ink is exposed to the light in the foregoing embodiment, the invention may be applied to a phenolic ultraviolet-curing type ink. Furthermore, the invention may be applied to various resins which are exposed to light to be hardened.

The temperature of the water in the exposure tank 1 ranges between 10 and 20° C. in the foregoing embodiment. However, the water temperature may be increased as the hardening demands and set at a desired value. Furthermore, a liquid with a high specific gravity may be selected so that the pressure applied to the photo-curing type resin in the liquid is increased. In this case, the air bubble elimination performance can further be improved.

FIGS. 3A to 6C illustrate a second embodiment which is directed to the fabrication of a printed circuit board by a subtractive process. A copper-clad laminate is used as the printed circuit board 6 in the second embodiment. The copper-clad laminate comprises the base material such as a glass epoxy substrate 11 and copper foils 12 cladded to both sides of the substrate and serving as conductive layers respectively, as shown in FIG. 3A.

The following steps are sequentially executed for the printed circuit board 6. Through hole forming step:

Through holes 13 are formed in the printed circuit board 6 by means of a known drill (not shown). Plating step:

The printed circuit board 6 is then immersed in a chemical plating liquid so that a chemically plated layer 14 is formed over an entire area thereof including inner peripheral faces of the through holes 13, as shown in FIG. 4A. Since the chemically plated layer 14 is connected to the copper foils 12, an electroplated layer 15 of copper is formed on the chemically plated layer serving as a base electrode, as shown in FIG. 4B. Consequently, hole conductor layers 16 are formed on the inner peripheral faces of the through holes 13 respectively. Circuit pattern forming step:

Subsequently, an unnecessary portion of the conductive layer is removed so that a circuit pattern is formed. A known photoetching process can be employed for this purpose. More specifically, a photo-sensitive etching resist 17 is first printed on the printed circuit board 16. After having been dried, the resist 17 is exposed to light with a circuit pattern film being laid thereon. Upon development, a wiring substrate is obtained as shown in FIG. 5A. In the obtained wiring substrate, the hardened etching resist 17 is laid on a portion of the substrate to be left as the circuit pattern.

The printed circuit board 6 is then immersed in an etching liquid so that the electroplated layer 15, the chemically plated layer 14 and the copper foils 12 are dissolved to be removed, as shown in FIG. 5B. When the etching resist 17 is then removed, desired circuit patterns 18 are formed, as shown in FIG. 5C. Conductor embedding step:

A resin material is then applied to the surface of the printed circuit board 6 so that the printed circuit patterns 18 are embedded in the resin material. The epoxy indissoluble resist ink of the ultraviolet-curing type type is used as the resin material. This resist ink can be applied to the surface of the printed circuit board 6 by the normal screen printing process.

A resist ink 19 is first printed on one side of the printed circuit board 6 so that the circuit patterns 18 are embedded in the resist ink 19 as shown in FIG. 6A. In this case, the through holes 13 of the printed circuit board 6 are also filled with the resist ink 19. Exposing step:

The resist ink 19 is then exposed to light by the exposing apparatus such as employed in the first embodiment to thereby be hardened. The resist ink 19 is also printed on the opposite side of the printed circuit board 6 so that the circuit patterns 18 are embedded in the resist ink 19 at both sides of the printed circuit board 6. The resist ink 19 is again exposed to light to be hardened, as shown in FIG. 6B.

The printed circuit board 6 to which the resist ink 19 has been applied is conveyed over the exposure tank 1 as shown in FIG. 1 by the conveyor. First, the printed circuit board 6 is immersed in the water in the right-hand interior of the exposure tank 1. Since the resist ink 19 is indissoluble in water, the immersion does not result in any chemical changes in the ink 19. However, a temperature of the resist ink 19 is approximately equalized with the water temperature. Furthermore, water pressure is uniformly applied to the ink 19 when the printed circuit board 6 is impregnated in the water. Consequently, minute air bubbles unavoidably contained in the resist ink 19 during the screen printing may be forced out by the water pressure to thereby be moved near the surface.

The printed circuit board 6 is then moved in the water between the exposure windows 3 in the exposure tank 1. During the movement of the printed circuit board 6 through the water channel between the exposure windows, the ultraviolet light from the light sources 5 is irradiated to the resist ink 19 so that hardening is started. A time period of the ultraviolet irradiation is equal to a time period required for securing an amount of ultraviolet light necessary for the hardening of the resist ink 19. The ultraviolet light is generally irradiated for a short time period from one minute to one minute and thirty seconds. A large radiant heat energy from the light sources 5 tends to increase the temperature of the resist layer during the ultraviolet irradiation. In the embodiment, however, the resist ink 19 is immersed in the low-temperature water. Furthermore, a wide area of the resist ink 19 is in contact with the water. Consequently, the increase in the temperature of the resist ink 19 is reliably restrained by the heat sinking property of the water. The temperature of the resist ink 19 is within the set range of the water temperature between 10 and 20° C.

Thus, substantially no air bubbles are formed in the resist ink 19 due to a rapid increase in the temperature. This, together with the movement of the air bubbles near the surface as described above, can reliably prevent the voids from remaining in the hardened resin layer. This sufficiently improves the characteristics of the hardened resist of the printed circuit board, for example, the heat-resistance, moisture-resistance, electrical resistance, etc. As a result, a high quality of resist 19 can be obtained.

Furthermore, since the ink 19 is hardened under the condition at the predetermined temperature, the bridging density thereof can be within an expected range. Consequently, the resist 19 can be prevented from being excessively hardened by an excessive increase in the bridging density. Furthermore, since the light sources 24 are disposed outside the exposure tank 20 and accordingly, separated from the water in the tank, an insulating structure of each light source 24 and accordingly the maintenance thereof can be simplified. Additionally, since an amount of heat generated by each light source 24 to penetrate into the exposure tank 1 is reduced, the temperature of the water can readily be controlled. This increases the accuracy in the control of the temperature of the resist 19 during the hardening.

Upon completion of the exposure, the printed circuit board 6 is lifted out of the exposure tank 20 by the conveyor and moved to a drier (not shown) for drying. Grinding step:

The grinding step is finally carried out after the resist 19 has been hardened. A grinding machine such as a belt thunder or buff grinder is used. The resist 19 hardened so as to cover the circuit patterns 18 is smoothly ground until the circuit pattern 18 is exposed on the surface. Although the upper surface of the circuit pattern 18 is exposed after the grinding, regions between the circuit patterns 18 are buried by the resist 19, as shown in FIG. 6C.

Since the air bubbles gather near the surface of the hardened resist 19 as described above, the resist 19 is desirably ground even when it is hardened. Furthermore, the electric characteristics of the resist 19 can be maintained at a sufficiently high level since the number of air bubbles remaining or produced therein is small.

Subsequently, the fabrication of the printed circuit board 6 is completed after later steps such as washing and drying.

According to the second embodiment, the regions between the circuit patterns 18 are buried by the resist 19, and the circuit patterns and the hardened resist 19 are at the same level such that the surface of the printed circuit board 6 is rendered flat. In other words, since the sides of the conductors constituting the circuit patterns 18 are covered with the resist 19, penetration of solder to the sides of the circuit board can be prevented. Consequently, the method of the second embodiment can achieve the same narrow pattern pitch as in a printed circuit board fabricated by the full-additive process. Moreover, the circuit patterns 18 are formed by the etching process in which the unnecessary portions of the copper foils 12 are removed as in the subtractive process. Consequently, a higher productivity and a lower production cost can be accomplished.

Since the through holes 13 are filled with the resist 19, the characteristics thereof can be prevented from being reduced due to entry of foreign matters thereinto. As a result, a high performance of printed circuit board can be provided.

Although the through holes are formed in the printed circuit board 6 in the foregoing embodiment, they may or may not be formed. The above-described through hole forming and plating steps can be eliminated when no through holes are formed in the printed circuit board.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. An apparatus for exposing a photocurable resin which is hardened when exposed to light, comprising:

an exposure tank in which a liquid which does not dissolve the photocurable resin is reserved; and a light source for irradiating light to the photocurable resin to be immersed in the liquid reserved in the tank, wherein the exposure tank has a side wall which has an exposure window defined by a transparent plate, and the light from the light source is irradiated through the transparent plate to the photocurable resin from outside the exposure tank.

2. An apparatus for exposing a photocurable resin which is hardened when exposed to light, comprising:

an exposure tank in which a liquid which does not dissolve the photocurable resin is reserved; and a light source for irradiating light to the photocurable resin to be immersed in the liquid reserved in the tank, wherein the exposure tank has two opposite side walls which have exposure windows defined by transparent plates respectively, and which further comprises a plurality of light sources disposed so as to correspond to the respective exposing windows.

3. The apparatus according to claim 1, further comprising a liquid circulating passage through which the liquid reserved in the exposure tank is circulated, and a heat exchanger provided in the liquid circulating passage for exchanging heat of the liquid so that the temperature of the liquid is maintained in a predetermined range.

4. The apparatus according to claim 2, further comprising a liquid circulating passage through which the liquid reserved in the exposure tank is circulated, and a heat exchanger provided in the liquid circulating passage for exchanging heat of the liquid so that the temperature of the liquid is maintained in a predetermined range.

* * * * *